(12) United States Patent
Chin et al.

(10) Patent No.: US 8,370,706 B2
(45) Date of Patent: Feb. 5, 2013

(54) INTERLEAVED CORRECTION CODE TRANSMISSION

(75) Inventors: Chung Kuang Chin, Saratoga, CA (US); Edward E. Sprague, Woodside, CA (US); Swaroop Raghunatha, Milpitas, CA (US)

(73) Assignee: Infinera Corporation, Sunnyvale, CA (US)

( * ) Notice: Subject to any disclaimer, the term of this patent is extended or adjusted under 35 U.S.C. 154(b) by 487 days.

(21) Appl. No.: 12/572,422

(22) Filed: Oct. 2, 2009

(65) Prior Publication Data
US 2011/0083051 A1 Apr. 7, 2011

(51) Int. Cl.
*H03M 13/00* (2006.01)
*H03M 13/03* (2006.01)
*G06F 11/00* (2006.01)
*H04B 3/46* (2006.01)

(52) U.S. Cl. ........ 714/758; 714/757; 714/784; 714/752; 714/786; 714/821; 370/216; 370/241; 370/242; 375/224

(58) Field of Classification Search .................. 714/758, 714/757, 784, 752, 786, 821; 370/216, 241, 370/242; 375/224
See application file for complete search history.

(56) References Cited

U.S. PATENT DOCUMENTS

| | | | | | |
|---|---|---|---|---|---|
| 5,825,807 | A * | 10/1998 | Kumar | ........................ | 375/130 |
| 5,862,175 | A * | 1/1999 | Sugiyama et al. | ............ | 375/219 |
| 6,564,343 | B1 * | 5/2003 | Yamashita | ................... | 714/701 |
| 6,856,741 | B2 * | 2/2005 | Britz | ............................. | 385/124 |
| 6,904,555 | B2 * | 6/2005 | Nagase et al. | ................ | 714/751 |
| 6,983,412 | B2 * | 1/2006 | Fukumasa | .................... | 714/755 |
| 7,848,218 | B2 * | 12/2010 | Lee et al. | ...................... | 370/208 |
| 7,933,352 | B2 * | 4/2011 | Choi et al. | ..................... | 375/261 |
| 8,135,082 | B2 * | 3/2012 | Choi et al. | ..................... | 375/264 |
| 8,229,016 | B2 * | 7/2012 | Okamura et al. | ............. | 375/267 |
| 2004/0196780 | A1 * | 10/2004 | Chin et al. | ..................... | 370/208 |
| 2004/0223553 | A1 * | 11/2004 | Kumar | ......................... | 375/259 |
| 2006/0182207 | A1 * | 8/2006 | Lee et al. | ...................... | 375/347 |
| 2006/0224651 | A1 * | 10/2006 | Madhavapeddi et al. | ..... | 708/404 |
| 2007/0162819 | A1 * | 7/2007 | Kawamoto et al. | ........... | 714/758 |
| 2008/0052609 | A1 * | 2/2008 | Peng et al. | .................... | 714/799 |
| 2009/0022237 | A1 * | 1/2009 | Wang et al. | ................... | 375/260 |
| 2010/0054360 | A1 * | 3/2010 | Sakai | ............................ | 375/295 |
| 2010/0189162 | A1 * | 7/2010 | Yoshimoto et al. | ........... | 375/141 |
| 2010/0235710 | A1 * | 9/2010 | Kawamoto et al. | ........... | 714/752 |
| 2010/0329401 | A1 * | 12/2010 | Terry | ............................ | 375/346 |
| 2011/0280261 | A1 * | 11/2011 | Varadarajan et al. | ......... | 370/475 |

* cited by examiner

*Primary Examiner* — John J Tabone, Jr.
(74) *Attorney, Agent, or Firm* — Harrity & Harrity, LLP; David L. Soltz

(57) ABSTRACT

An optical device transmits ECC codewords using an interleaved technique in which a single ECC codeword is transmitted over multiple optical links. In one particular implementation, the device may include an ECC circuit configured to supply ECC codewords in series, the codewords being generated by the ECC circuit based on input data and each of the codewords including error correction information and a portion of the data. The device may further include a serial-to-parallel circuit configured to receive each of the codewords in succession, and supply data units in parallel, each of the data units including information from a corresponding one of the codewords; an interleaver circuit to receive the data units in parallel and output a second data units in parallel, each of the second data units including bits from different ones of the data units; and a number of output lines, each of which supplying a corresponding one of the second data units.

12 Claims, 13 Drawing Sheets

INTERLEAVED CORRECTION CODE TRANSMISSION

BACKGROUND

Optical networks transmit data over optical fiber. In an optical network, multiplexing protocols such as synchronous optical networking (SONET) and synchronous digital hierarchy (SDH) may be used to transfer multiple digital bit streams over the same optical fiber or link. Lasers or light emitting diodes (LEDs) may be used to generate optical signals that carry the digital bit streams.

Bit streams traversing an optical network may pass through transponder switches. Such a switch may, for example, connect to multiple different fiber ports. Bit streams may be received at the switch, converted to an electrical signal, switched to the appropriate output port based on the electrical signal, converted back to an optical signal, and output as an optical signal on the determined output port.

Data transmitted over the optical links in the optical network may be encoded with error correction information. For example, an error-correcting code (ECC) may be added to the data. The ECC may include redundant data that is used to correct transmission errors in the data. If the number of errors experienced during transmission is within the capability of the ECC being used, the receiving transponder switch may use the extra information to discover the locations of the errors and correct the errors.

When a data signal is transmitted over an optical link, errors on the link may tend to occur in groups. For example, a multi-bit error that occurs over four consecutive bits may be more likely than four independent single bit errors. Although ECC information added to data may allow for the correction of single bit and some multi-bit error, at some point, too many errors in a codeword will prohibit correction of the error at the receiver.

SUMMARY

According to one implementation, a device may include a number of input lines, the input lines carrying data; an ECC circuit coupled to the input lines, the ECC circuit supplying a codewords in series, the codewords being generated by the ECC circuit based on the data, each of the codewords including error correction information and a portion of the data; a serial-to-parallel circuit configured to receive each of the codewords in succession, and supply a first data units in parallel, each of the first data units including information from a corresponding one of the plurality of codewords; an interleaver circuit configured to receive the first data units in parallel and output second data units in parallel, each of the second data units including bits from different ones of the first data units; and output lines, each of which supplying a corresponding one of the second data units.

According to another implementation, a device may include an ECC circuit to generate error correction information for sequentially received input data and output sequential ECC codewords, each of the sequential ECC codewords including the received data and error correction information corresponding to the received data; a serial-to-parallel circuit to convert the sequential codewords generated by the ECC circuit to codewords that overlap one another; an interleaver circuit to interleave the overlapping codewords; and optical output lines connected to transmit the interleaved codewords, where consecutive bits transmitted on each of the optical output lines includes bits corresponding to different ones of the sequential codewords.

In another implementation, an ECC device may include input data lines, each of the input data lines receiving serial data in which ECC information is interleaved in the serial data so that multiple sequential bits received on the input data lines are bits corresponding to different ECC codewords, where each ECC codeword includes data and error correction information generated for the data; a serial-to-parallel circuit to convert the received serial data to parallel data; an interleaver to de-interleave the parallel data so that groups of bits within the parallel data include bits from a same one of the different ECC codewords; a parallel-to-serial circuit to receive the de-interleaved parallel data to convert the de-interleaved parallel data to serial data; and an ECC circuit connected to receive the serial data and correct errors in the serial data based on the ECC codewords.

In yet another implementation, an ECC device may include means for generating, based on data received on a plurality of input lines, a plurality of sequential ECC codewords, the plurality of codewords being generated based on the data, each of the codewords including error correction information and a portion of the data. The device may further include means for receiving each of the codewords in succession and supplying first data units in parallel, each of the first data units including information from a corresponding one of the codewords; means for receiving the first data units in parallel and outputting second data units in parallel, each of the second data units including bits from different ones of the first data units; and means for outputting a corresponding one of the second data units

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements.

Implementations, described herein, may provide for transmission of ECC codewords using an interleaved technique in which a single codeword is transmitted over multiple optical links and where consecutive bits on optical link correspond to different codewords. The interleaving of the codewords may be performed by a serial-to-parallel circuit, interleaver circuit, and parallel-to-serial circuit. By spreading (interleaving) codewords over multiple optical links, a multi-bit error on a link may correspond to single bit errors in multiple different codewords. The interleaved data may thus be more resistant to clusters of multi-bit errors that may tend to occur on a particular optical link.

Exemplary Network

Figure 1:
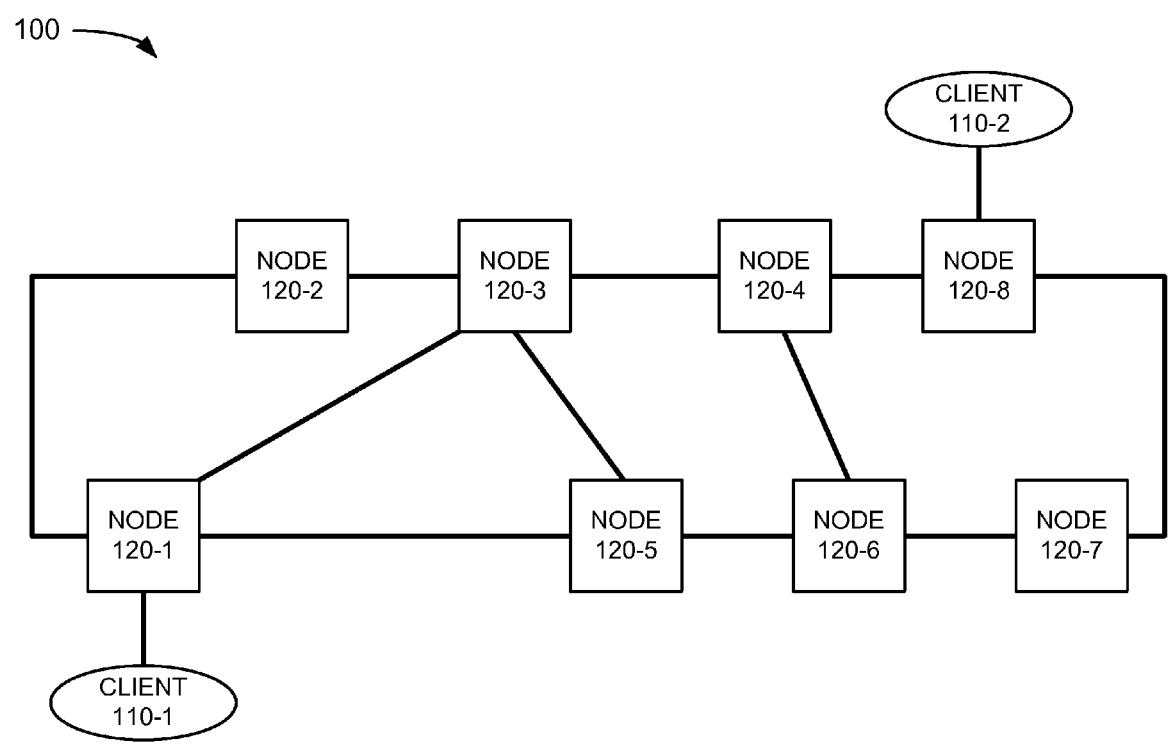
FIG. 1 is a diagram of an exemplary network in which systems and/or methods described herein may be implemented.

FIG. 1 is a diagram of an exemplary network 100 in which systems and/or methods described herein may be implemented. Network 100 may include clients 110-1 and 110-2 (referred to collectively as "clients 110," and generally as "client 110") and nodes 120-1, . . . , 120-8 (referred to collectively as "nodes 120," and generally as "node 120"). While FIG. 1 shows a particular number and arrangement of devices, network 100 may include additional, fewer, different, or differently arranged devices than those illustrated in FIG. 1. Also, the connections between devices may include direct or indirect connections.

Client 110 may include any type of network device, such as a router, a switch, or a central office, that may transmit data traffic. In one implementation, client 110 may transmit a client signal (e.g., a synchronous optical network (SONET) signal, a synchronous digital hierarchy (SDH) signal, an Ethernet signal, or another type of signal) to node 120. The client signal may conform to any payload type, such as Gigabit Ethernet (GbE), 2xGbE, Fibre Channel (FC), 1GFC, 10 GbE local area network (LAN) physical layer (Phy), 10 GbE wide area network (WAN) Phy, Synchronous Transport Mode 16 (STM-16), STM-64, Optical Carrier level 48 (OC-48), or OC-192.

Nodes 120 may be nodes in an optical network, or an optical portion of a network. Nodes 120 may be connected via optical links. Data traffic may flow from node-to-node over a series of channels/sub-channels forming a path. Any two nodes 120 may connect via multiple optical links. For bidirectional communication, for example, a first optical link may be used for data traffic transmitted in one direction, a second optical link may be used for data traffic transmitted in the opposite direction, and a third optical link may be used in case of a failure on the first link or the second link.

Each node 120 may act as, among other things, an optical switching device in which data is received over an optical link, converted to electrical signals, switched based on the electrical signals, and then output, as an optical signal, to an optical link determined by the switching.

Exemplary Node Components

Figure 2:
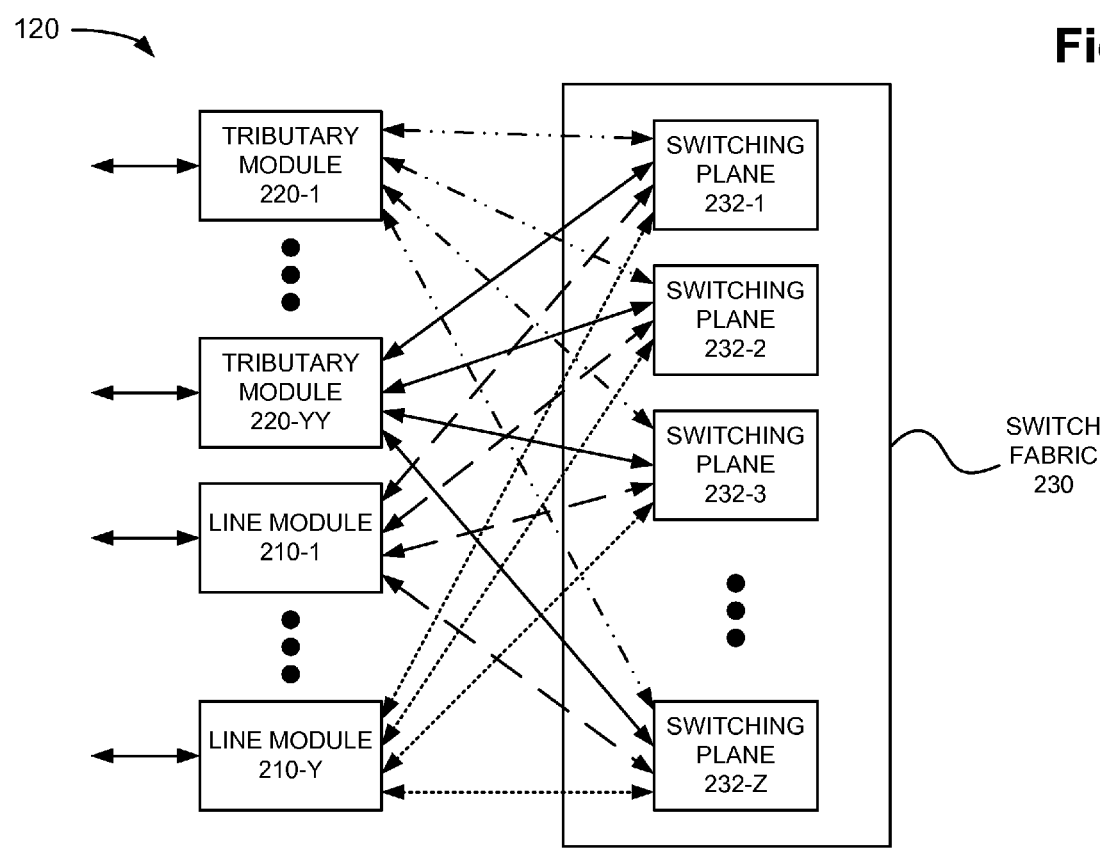
FIG. 2 is a diagram of exemplary components of a node shown in FIG. 1.

FIG. 2 is a diagram of exemplary components of node 120. As shown in FIG. 2, node 120 may include line modules 210-1, . . . , 210-Y (referred to collectively as "line modules 210," and generally as "line module 210") (where Y≧1) and tributary modules 220-1, . . . , 220-YY (referred to collectively as "tributary modules 220," and generally as "tributary module 220") (where YY≧1) connected to a switch fabric 230. As shown in FIG. 2, switch fabric 230 may include switching planes 232-1, 232-2, . . . 232-Z (referred to collectively as "switching planes 232," and generally as "switching plane 232") (where Z≧1). While FIG. 2 shows a particular number and arrangement of components, node 120 may include additional, fewer, different, or differently arranged components than those illustrated in FIG. 2. Also, it may be possible for one of the components of node 120 to perform a function that is described as being performed by another one of the components.

Line module 210 may include hardware components, or a combination of hardware and software components, that may provide network interface operations. Line module 210 may receive a multi-wavelength optical signal and/or transmit a multi-wavelength optical signal. A multi-wavelength optical signal may include a number of optical signals of different optical wavelengths. In one implementation, line module 210 may perform retiming, reshaping, regeneration, time division multiplexing, and/or recoding services for each optical wavelength. Line module 210 may also convert input optical signals into signals represented as electrical signals.

Tributary module 220 may include hardware components, or a combination of hardware and software components, that may support flexible adding or dropping of multiple services, such as SONET/SDH services, GbE services, optical transport network (OTN) services, and FC services. Tributary module 220 may be particularly used to connect nodes 120 to clients 110. Tributary module 220 may also convert input optical signals into signals represented as electrical signals.

Switch fabric 230 may include hardware components, or a combination of hardware and software components, that may provide switching functions to transfer data between line modules 210 and/or tributary modules 220. In one implementation, switch fabric 230 may provide fully non-blocking transfer of data. Each switching plane 232 may be programmed to transfer data from a particular input to a particular output. Switching planes 232 may generally operate by storing data into multi-port digital memories, where data may be read into the digital memories at one port and read out at another port.

As shown in FIG. 2, each of line modules 210 and tributary modules 220 may connect to each of switching planes 232. The connections between line modules 210/tributary modules 220 and switching planes 232 may be bidirectional. While a single connection is shown between a particular line module 210/tributary module 220 and a particular switching plane 232, the connection may include a pair of unidirectional connections (i.e., one in each direction).

Error Correction Operation of Nodes 120

Figure 3:
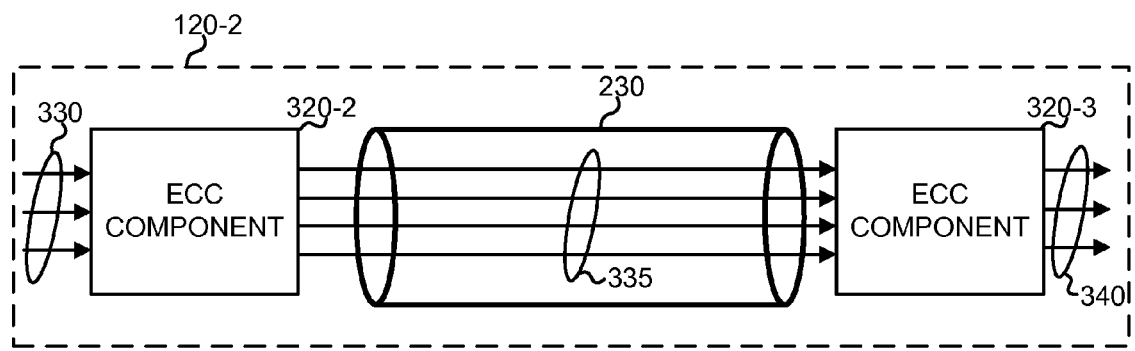
FIG. 3 is a diagram conceptually illustrating the use of error correcting codes as performed by the nodes shown in FIG. 1.

FIG. 3 is a diagram conceptually illustrating the use of error correcting codes as performed by a node 120 or between nodes 120. A node may use ECC techniques when transmitting data over switch fabric 230 to provide error correction over the switch fabric. An exemplary node 120-2 is shown in FIG. 3 as using an ECC technique for sending data over its switch fabric 230. In an alternative possible implementation, two nodes, such as nodes 120-2 and 120-3 may communicate with one another through a number of optical signals sent over optical channel 310, in which the interleaved ECC technique described herein is used to interleave signals sent over multiple links.

Node 120-2 may include error correction code (ECC) components 320-2 and 320-3, respectively. The ECC components 320 may be implemented in line modules 210 and/or tributary modules 220. ECC component 320-2 may operate as an ECC transmitter to receive incoming data signals, add error correction information to the data signals, and transmit the signals over channel 230. In practice, each line module 210 and/or tributary module 220 may include an ECC component 320 that includes functionality to implement both transmitting and receiving of ECC data. ECC component 320-3 may operate as an ECC receiver to receive the data signals, including the error correction information, and remove the error correction information to obtain the original data signals.

In the example of FIG. 3, three input data signals 330 are received by ECC component 320-2. Consistent with aspects described herein, data bits in the data signals 330 may be "shuffled" (i.e., interleaved) by ECC component 320-2 and output as data signals 335, where each of data signals 335 may include bits from different ones of input data signals 330. As shown, the three input data signals 330 may be output as four ECC data signals 335. Each of the four ECC data signals 335 may be transmitted over switch fabric 230 or over another serial link. After processing by ECC component 320-3, the original three serial data signals 340 may be obtained. To the extent possible based on the ECC being used, bit errors introduced during the transmission over switch fabric 230 may be corrected by ECC component 320-3. Advantageously, by interleaving data bits from the original three data signals over optical channel 310, multi-bit errors introduced on the transmission channel may be corrected.

Although the example of FIG. 3 illustrates ECC components that operate on three input data signals and generates four signals for transmission on the optical channel, in other implementations, more or fewer than three input signals and four signals for transmission over the channel may be used. Further, the data bit width of the signals, described as four bits wide in the description that follows, may in alternative implementations, be greater or less than four bits wide.

ECC Component

Figure 4:
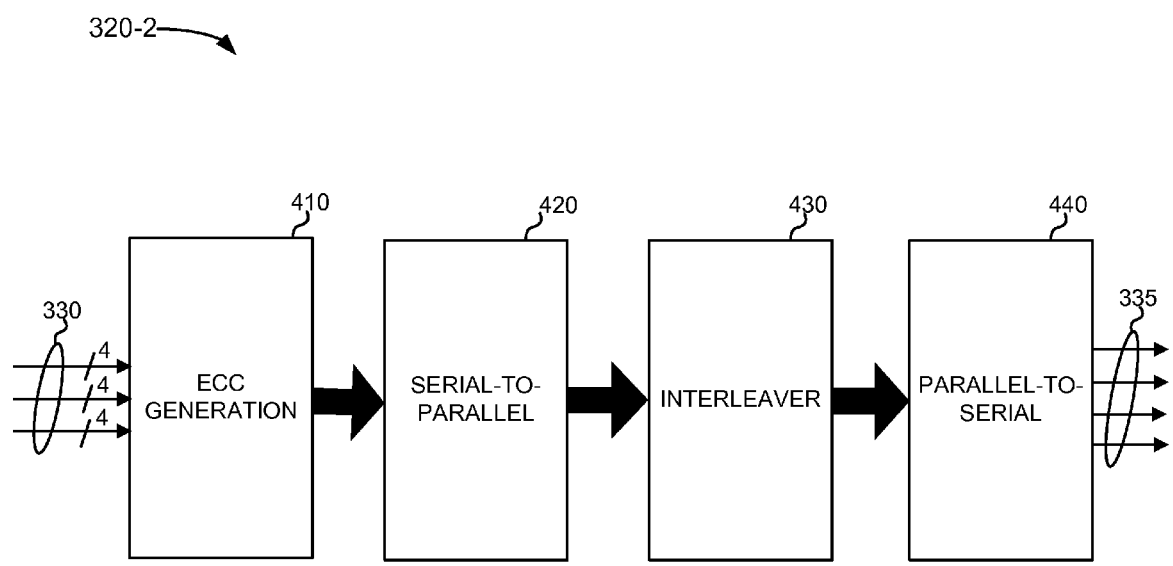
FIG. 4 is a diagram illustrating an exemplary implementation of an ECC component.

FIG. 4 is a diagram illustrating an exemplary implementation of ECC component 320-2. Signals input to ECC component 320-2 may be successively processed by ECC generation circuit 410, serial-to-parallel circuit 420, interleaver circuit 430, and parallel-to-serial circuit 440.

Input signals 330 may include, as shown in this implementation, three digital signals, each of which may be one or more bits wide. In this example, each input signal 330 includes a four-bit wide signal. Thus, for each input clock cycle, 12 data bits may be received by ECC component 320-2, corresponding to four bits for each of three signals. Four four-bit output signals 335 may be output by ECC component 320-2 every clock cycle. Each one of four-bit output signals 335 may include a bit from four different ECC codewords, where consecutive bits on any of the output signals 335 may correspond to different codewords.

ECC generation circuit 410 may receive input signals 330 and output the input signals along with one or more additional error correcting (ECC) bits. In this example, four ECC bits are generated for each input cycle, resulting in a total of 16 bits output from ECC generation circuit 410. A number of possible ECC techniques may be used to generate the ECC bits. For example, parity check codes, Hamming code, Reed-Solomon codes, or other known ECC techniques may be used to generate the ECC bits. The ECC technique used may particularly be a block code technique, in which information is processed on a block-by-block basis. Each "block" of ECC data may include both the original data and the ECC bits for the data. An ECC data block will be referred to as a codeword herein. As used herein, data that "includes" the original data and ECC bits may refer to a codeword in which the ECC bits are simply appended to the original data (i.e., the original data is present in the codeword in its original form) and codewords in which the ECC version of the codeword includes the ECC bits and the original data "mixed" (i.e., the original data may not be evident in the codeword by visual inspection until the codeword is decoded using the ECC technique that was used to encode the codeword).

Figure 5A:
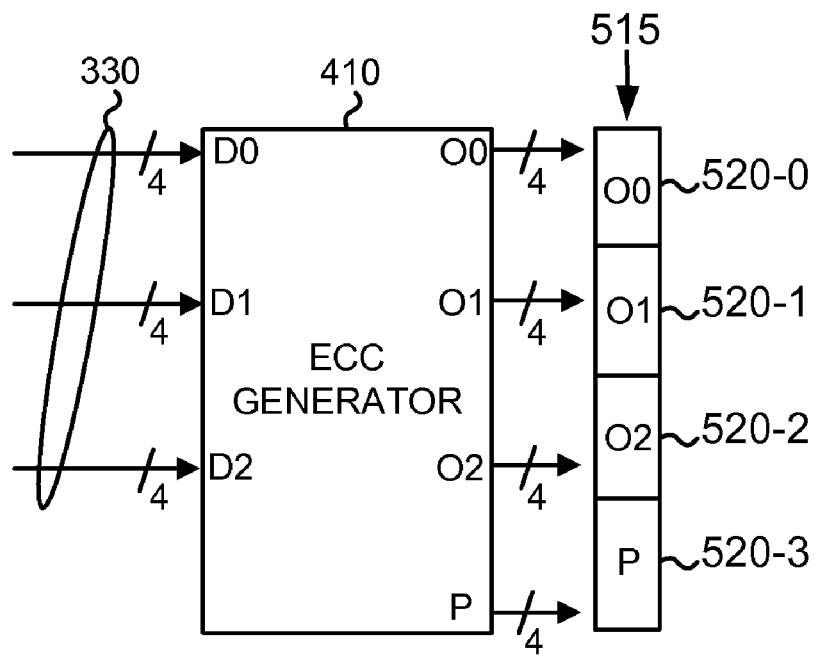
FIG. 5A is a block diagram illustrating operation of an ECC generation circuit.
Figure 5B:
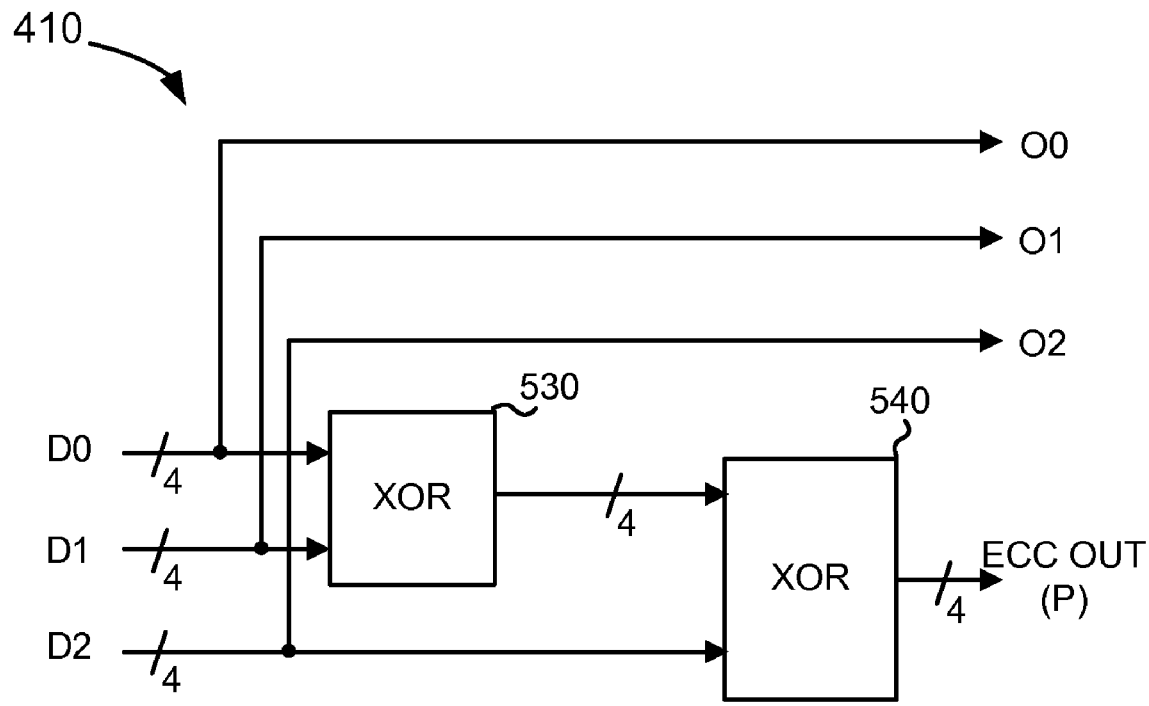
FIG. 5B is a diagram illustrating one possible implementation of an ECC generation circuit using parity check codes.

FIGS. 5A and 5B are diagrams illustrating exemplary implementations of ECC generation circuit 410 in additional detail. FIG. 5A is a block diagram illustrating operation of ECC generation circuit 410. FIG. 5B is a diagram illustrating one possible implementation of ECC generation circuit 410 using parity check codes.

In FIG. 5A, the input signals 330 are labeled as signals D0, D1, and D2, respectively. The output of ECC generation circuit 410 includes output signals O0, O1, and O2, which may be copies of input signals D0, D1, and D2. Additionally, a signal labeled P is also output from ECC generation circuit 410. P may include the ECC data bits. The set of O0, O1, O2, and P may be referred to as a single codeword, labeled as codeword 515. Codeword 515, after transmission over the channel (e.g., copper backplane or optical channel), may be examined and the values in P may potentially be used to determine whether there are errors in O0, O1, and/or O3, and potentially to correct the errors. As is further shown in FIG. 5A, codeword 515 may include four bits corresponding to D0 (group 520-0), four bits corresponding to D1 (group 520-1), four bits corresponding to D3 (group 520-2), and four bits corresponding to the ECC data bits (group 520-3).

FIG. 5B is a diagram illustrating an exemplary implementation of ECC generator circuit 410 using a parity check operation. ECC generator circuit 410 may include exclusive-OR (XOR) circuits 530 and 540. XOR circuit 530 may perform an XOR operation on corresponding bits in D0 and D1. Thus, the first bit of D0 may be XORed with the first bit of D1, the second bit of D0 may be XORed with the second bit of D1, etc. The four output bits of XOR circuit 530 may be input to XOR circuit 540 and XORed with corresponding bits of D2. Thus, the first output bit from XOR circuit 530 may be XORed with the first bit of D2, the second output bit from XOR circuit 530 may be XORed with the second bit of D2, etc.

Figure 6:
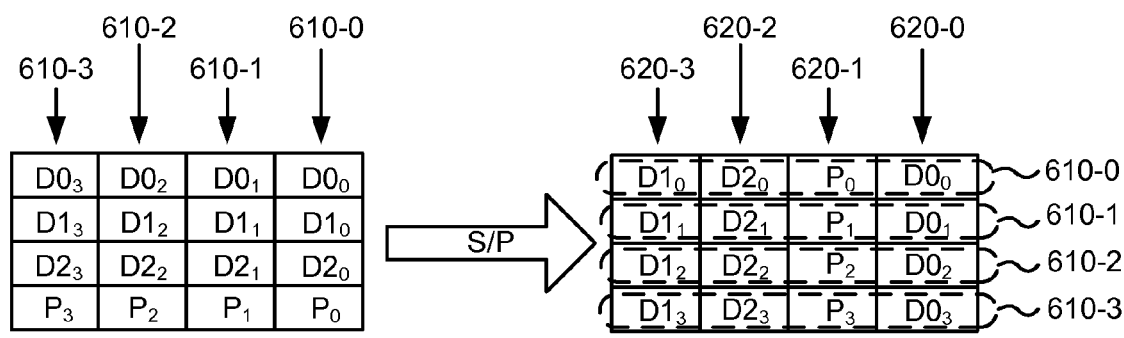
FIG. 6 is a timing diagram conceptually illustrating exemplary operation of a serial-to-parallel circuit.

Successive codewords output from ECC generation circuit 410 may be converted by serial-to-parallel circuit 420 into a 16-bit parallel output units that each includes four-bit groups from four successive codewords. FIG. 6 is a diagram conceptually illustrating exemplary operation of serial-to-parallel circuit 420.

Each clock cycle, a codeword 610-0 through 610-3, may be received by serial-to-parallel circuit 420. As previously mentioned, each codeword, such as codeword 610-0, may include four-bit groups from each data signal D0, D1, D2, and the ECC data P. Successive codewords are denoted by subscript numbering in FIG. 6, so the first codeword output from ECC generator circuit 410 is represented with the subscript 0, the second codeword with the subscript 1, and so on. After serial-to-parallel conversion, each 16-bit output may include successive data corresponding to a single signal D0, D1, D2, or P. Each 16-bit output is labeled in FIG. 6 as "mixed" or "overlapped" codewords 620-0 through 620-3. As can be seen, each mixed codeword 620 may include groups from four different codewords 610. The original codewords 610 are staggered in time.

One particular possible implementation of serial-to-parallel circuit 420 will be described in more detail below with reference to FIGS. 10-12.

Figure 7:
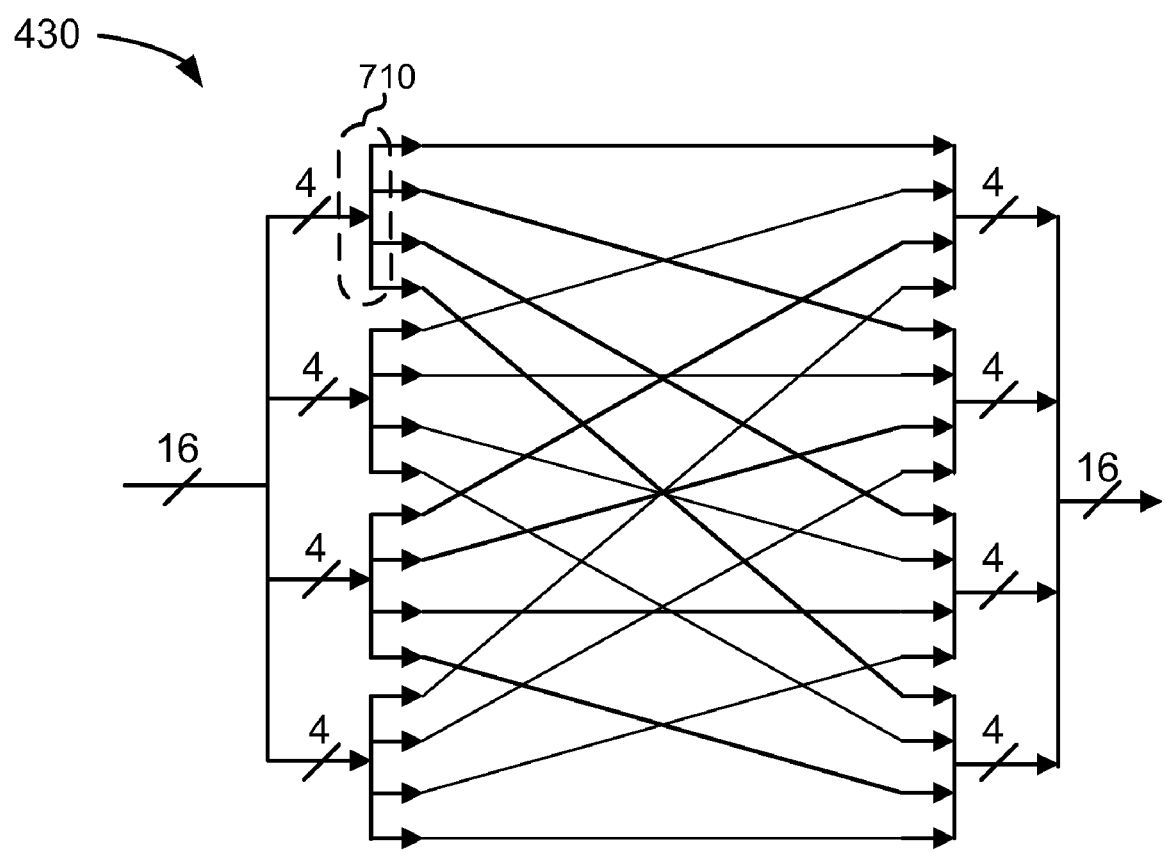
FIG. 7 is a diagram illustrating an exemplary implementation of an interleaver circuit.

Referring back to FIG. 4, interleaver circuit 430 may operate on mixed codewords 620 to rearrange the bits of each group so that each four-bit output group of interleaver circuit 430 contains one bit from each input group. FIG. 7 is a diagram illustrating an exemplary implementation of interleaver circuit 430.

As shown in FIG. 7, for each four-bit group of data, such as group 710 (e.g., corresponding to $D0_0$ in FIG. 6), each of the four bits are interleaved to a different output group. More specifically, interleaver circuit 430 may group bits based on the order of the bits in a codeword, so bit zero of four successive codewords may be grouped, bit one of the four codewords may be grouped, and so on. In this manner, each output group may include bits from different input groups.

Although interleaver 430 is shown in FIG. 7 as a hardwired re-routing of groups of data, in other possible implementations, other interleaving techniques could be used. For example, switching memory could be used to interleave data.

Figure 8:
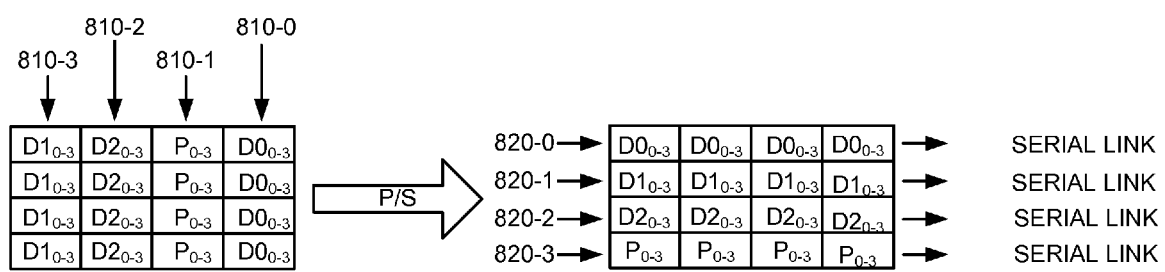
FIG. 8 is a timing diagram conceptually illustrating exemplary operation of a parallel-to-serial circuit.

The parallel interleaved data output from interleaver circuit 430 may next be processed by parallel-to-serial circuit 440. Parallel-to-serial circuit 440 may generally operate to convert the parallel groups of interleaved data to serial groups of data. FIG. 8 is a timing diagram conceptually illustrating exemplary operation of parallel-to-serial circuit 440.

Inputs to parallel-to-serial circuit 410 are illustrated in FIG. 8 in columns 810-0 through 810-3. As shown, column 810-0, for example, includes data from signal D0. Due to the interleaving, each row (group) in column 810-0 may include bits from four successive samples of D0, represented by the subscript notation "0-3". Because each successive time sample may correspond to a new ECC codeword, each group in column 810-0 therefore includes a bit from four different codewords. Similarly, for columns 810-1, 810-2, and 810-3, each group in these columns includes a bit from four different codewords.

After operation of parallel-to-serial circuit 440, each column 810 may be transposed and the data units in each column arranged serially. Thus, as shown, column 810-0 may be arranged as row 820-0, column 810-1 may be arranged as row 820-1, column 810-2 may be arranged as row 820-2, and column 810-3 may be arranged as row 820-3. Each row may be transmitted over a serial link in channel 230. Advantageously, because each group of data within a row includes bits from different codewords, multi-bit contiguous errors on the optical link may be spread among multiple codewords, thus potentially allowing for the correct reconstruction of all of the codewords using the ECC technique. For instance, in the example implementation discussed, where each group of data includes four bits, corresponding to four different codewords, an N-bit contiguous error on the optical link may correspond to an N/4 bit error in each codeword that be reconstructed at the receiving ECC component 320-3.

Figure 9:
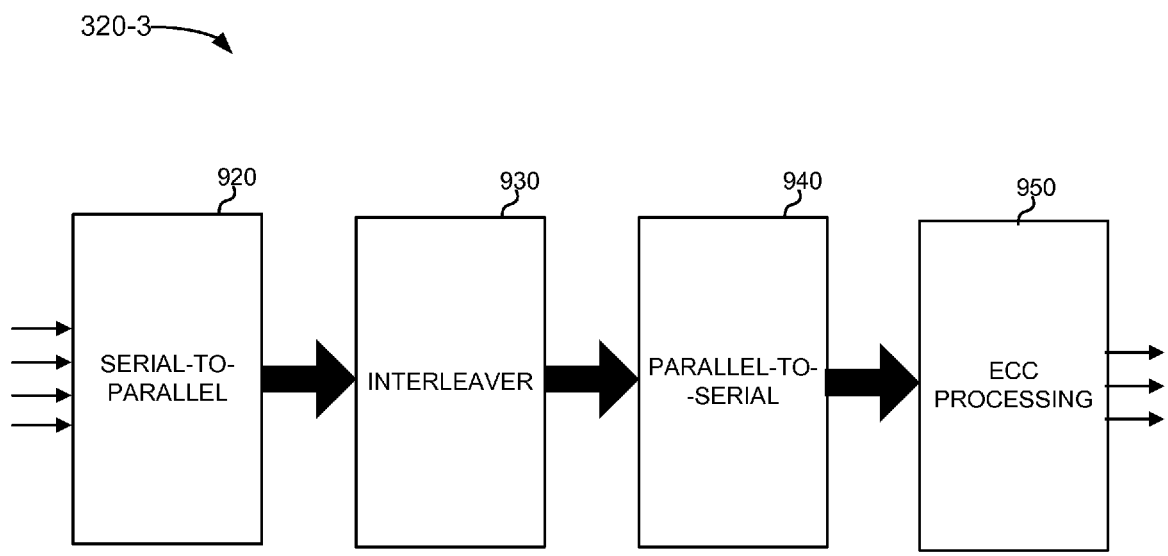
FIG. 9 is a diagram illustrating an exemplary implementation of an ECC receiving component.

FIG. 9 is a diagram illustrating an exemplary implementation of ECC component 320-3. ECC component 320-3 may generally operate to process the data received over channel 230 by reconstructing codewords 610 and using the ECC technique to determine, and possibly correct, codewords with errors.

ECC component 320-3 may include circuits similar to those in ECC component 320-2. As shown in FIG. 9, ECC component 320-3 may include serial-to-parallel circuit 920, interleaver circuit 930, parallel-to-serial circuit 940, and ECC processing circuit 950. Serial-to-parallel circuit 920 may receive the signals received over optical channel 310 and convert the serial streams into 16-bit parallel interleaved codewords, each corresponding to a particular data signal O0, O1, O2, or P. After processing by serial-to-parallel circuit 920, the interleaved parallel codewords may be similar to the interleaved codewords shown in columns 810 (FIG. 8). Interleaver 930 may then interleave the interleaved codewords to effectively de-interleave the codewords. Interleaver circuit 930 may be implemented similarly to interleaver circuit 430. At this point, the parallel codewords may be similar to the mixed codewords 620 (FIG. 6). Parallel-to-serial circuit 940 may next process the mixed codewords to obtain codewords similar to codewords 610 (FIG. 6). At this point, codewords 610 may be in the original form generated by ECC generation circuit 410 and may be processed by ECC processing circuit 940. ECC processing circuit 950 may, based on the ECC technique being used, examine the ECC bits for each codeword to determine if the codeword contains errors. Some ECC techniques additionally allow errors to be corrected within the codeword.

Serial-to-Parallel Circuit

Serial-to-parallel circuits 420 and 920 may be implemented using a number of possible parallelization techniques. One example of a circuit that may be used to efficiently perform the serial-to-parallel conversion will now be described with reference to FIGS. 10-12.

Figure 10:
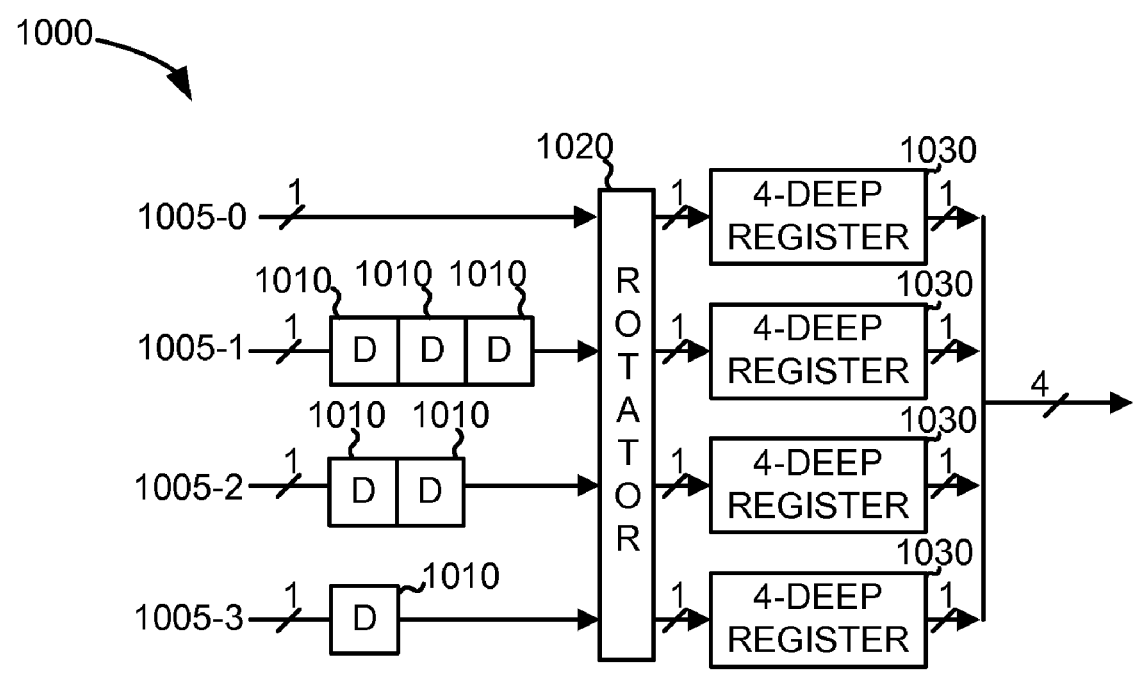
FIG. 10 is a diagram illustrating an exemplary serial-to-parallel circuit.

FIG. 10 is a diagram illustrating an exemplary serial-to-parallel circuit 1000. For simplicity, serial-to-parallel circuit 1000 will be described as receiving four one-bit serial data streams and converting four successive data bits on each stream to a single four-bit parallel output. It can be appreciated that the width of each input data stream or the number of input data streams may be changed in different implementations. In the previous exemplary implementation of serial-to-parallel circuits 420 and 920, for instance, the serial-to-parallel circuits were described as operating on four four-bit wide data streams.

Serial-to-parallel circuit 1000 may include a number of delay elements 1010, a rotator 1020, and 4-deep registers 1030. Serial-to-parallel circuit 1000 may operate on input data streams 1005-0 through 1005-3.

Data streams 1005-0 through 1005-3 may be initially delayed by delay elements 1010. Each of delay elements 1010 may be implemented as, for example, a capacitive delay element, a digital latch, or another delay element. Each delay element may delay its input one clock cycle. As shown in FIG. 10, data stream 1005-0 is not delayed, data stream 1005-1 may pass through three delay elements 1010 (i.e., three clock cycles), data stream 1005-2 may pass through two delay elements 1010 (i.e., two clock cycles), and data stream 1005-3 may pass through one delay element 1010 (i.e., one clock cycle). In this manner, incoming data bits for different data streams are offset from one another when reaching rotator 1020.

Rotator 1020 may receive, in each clock cycle, the group of data bits (e.g., four bits in the illustrated implementation) from signal lines 1005-0 through 1005-3. Rotator 1020 may generally operate to "rotate" its input based on a rotate count value. In rotating its input, rotator 1020 may switch signals on the four input lines to various ones of the four output lines. Which input lines get switched to which output lines may depend on the rotate count value.

Figure 11:
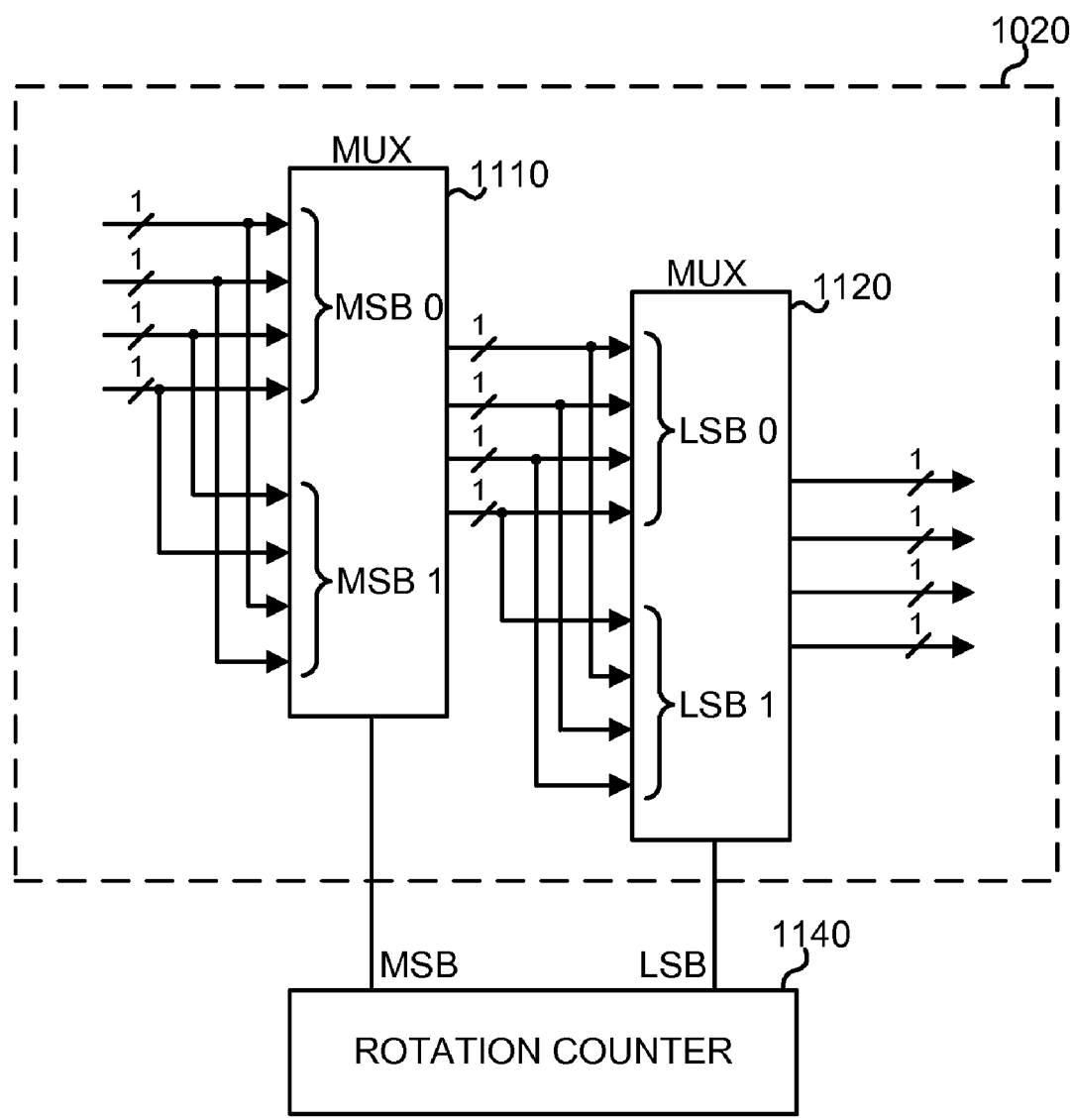
FIG. 11 is a diagram illustrating an exemplary implementation of a rotator in the circuit shown in FIG. 10.

FIG. 11 is a diagram illustrating an exemplary implementation of rotator 1020. The four input signals received by rotator 1020 may be input to a first multiplexer 1110. The output of first multiplexer 1110 may be output to second multiplexer 1120. Multiplexers 1110 and 1120 may each be eight input, four output (8:4) multiplexers. Multiplexers 1110 and 1120 may each receive the eight inputs, replicated into two groups of four, and output four signals (one of the two groups) based on an input control line. The input control line for multiplexer 1110 may be the most significant bit (MSB) of a two-bit output of rotation counter 1140 and the input control line for multiplexer 1120 may be the least significant bit (LSB) of the two-bit output of rotation counter 1140. Rotation counter 1140 may be implemented as a two-bit counter. In one implementation, multiplexers 1110 and 1120 may be implemented using four separate 2:1 multiplexers (e.g., controlled switches).

Table I, below, illustrates a rotation operation as performed by rotator 1020. In Table I, assume the input signals to rotator 1020 are labeled "a", "b", "c", and "d". The output, rotated signals, for each of the four rotation count values are shown in the table. For example, when the rotation count equals two (i.e, MSB=1 and LSB=0), the output signals would be "c", "d", "a", "b". As can be observed in Table I, over the course of the rotation count, the signal at any particular input location is switched to be output once at each of the output locations (i.e., the input at "a" is variously output at "a", "d", "c", and "b"; the input at "b" is variously output at "b", "a", "d", and "c", etc.).

TABLE I

| | ROTATION COUNT | | | |
|---|---|---|---|---|
| Inputs | 0 | 1 | 2 | 3 |
| a | a | b | c | d |
| b | b | c | d | a |
| c | c | d | a | b |
| d | d | a | b | c |

Returning to FIG. 10, 4-deep registers 1030 may receive the values output from rotator 1020. Each of 4-deep register 1030 may include four registers to store four parallel bits. At each clock cycle, each 4-deep register 1030 may output one bit, providing, in total, a four-bit data unit. The four-bit data unit represents four parallel bits from one of input signal lines 1005.

Figure 12:
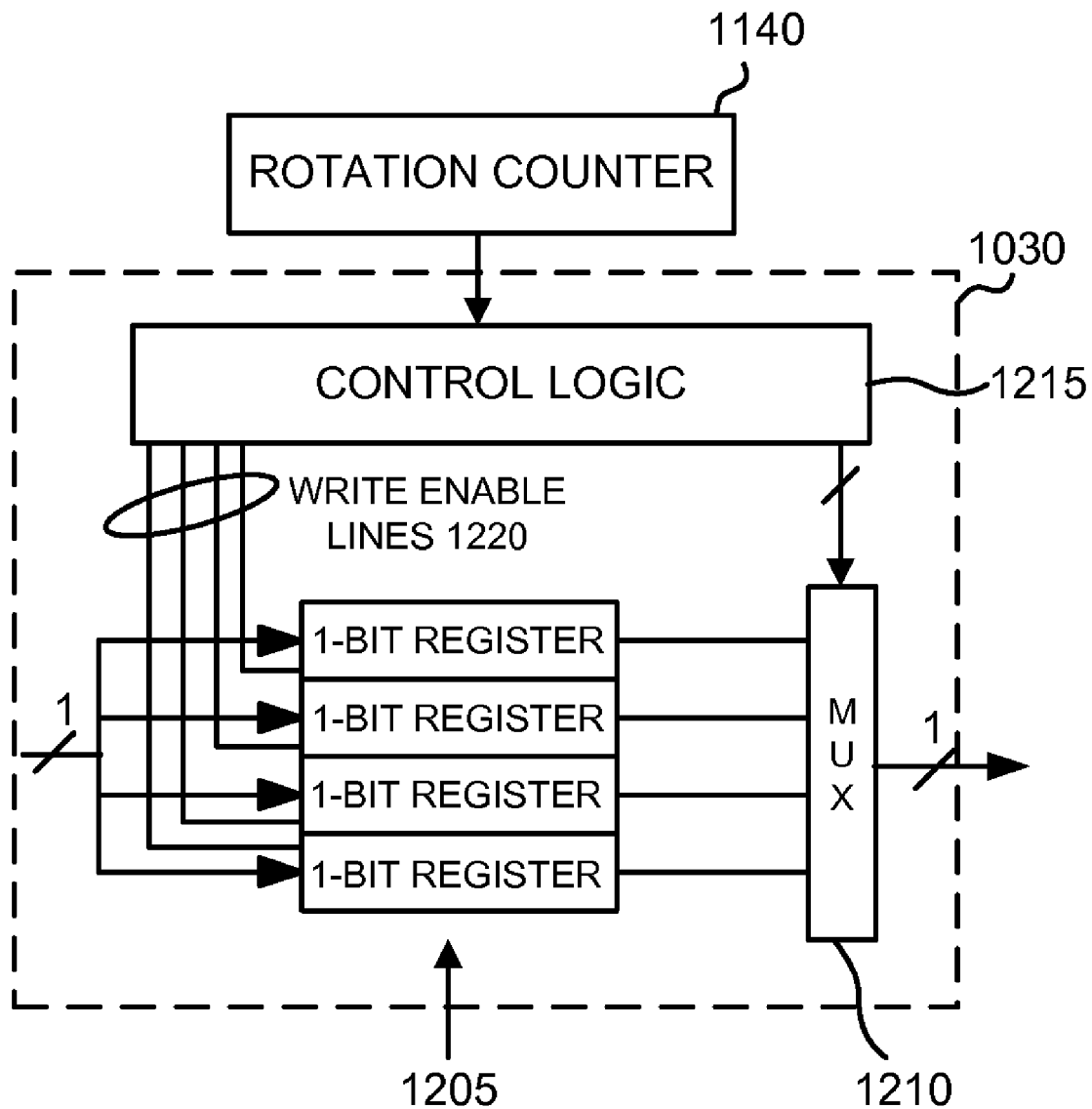
FIG. 12 is a diagram illustrating an exemplary implementation of one of the 4-deep registers shown in FIG. 10.

FIG. 12 is a diagram illustrating an exemplary implementation of one of 4-deep registers 1030. As shown, each of 4-deep registers 1030 may include four 1-bit registers 1205, each connected to one of the input signal lines and a multiplexer 1210. Multiplexer 1210 may include a 4:1 multiplexer that selects one of the outputs of the 1-bit registers 1205 to output. 1-bit registers 1205 and multiplexer 1210 may be controlled by control logic 1215 based on the output of rotation counter 1140. In particular, control logic 1215 may, in each clock cycle, enable one of 1-bit registers 1205 to write its input data bit. Control logic 1215 may simultaneously control multiplexer 1210 to select the output of another of 1-bit registers 1205 to output from 4-deep register 1030.

Collectively, each of the four 4-deep registers 1030 may be controlled to output four parallel bits from one of signal lines 1005-0 through 1005-3.

Parallel-to-Serial Circuit

Parallel-to-serial circuits 440 and 940 may be implemented using a number of possible serialization techniques. One example of a circuit that may be used to efficiently perform the parallel-to-serial conversion will now be described with reference to FIG. 13.

Parallel-to-serial circuits 440 and 940 generally operate to reverse the parallelization performed by serial-to-parallel circuits 420 and 920.

Figure 13:
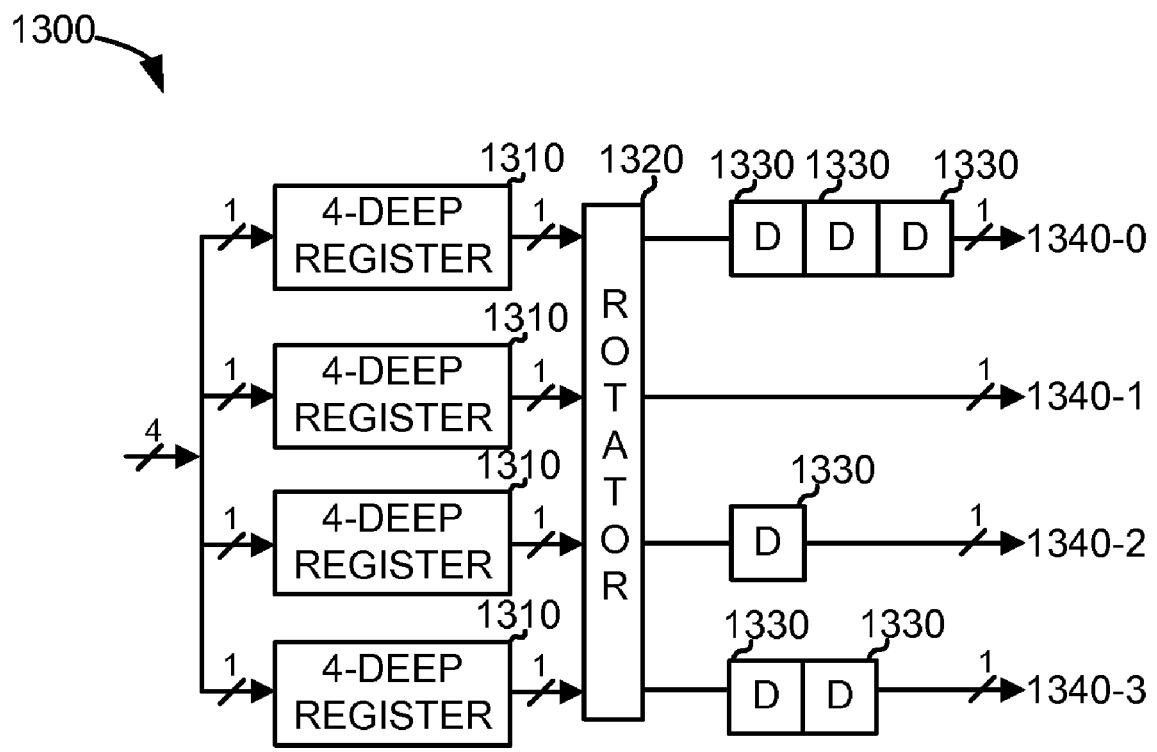
FIG. 13 is a diagram illustrating an exemplary parallel-to-serial circuit.

FIG. 13 is a diagram illustrating an exemplary parallel-to-serial circuit 1300. For simplicity, parallel-to-serial circuit 1300 will be described as serializing a four-bit wide data stream and converting the four-bit wide data stream into four successive bits in each of four output signals. It can be appreciated that the width of the input data stream or the number of output data streams may be changed in different implementations. In the previous exemplary implementation of parallel-to-serial circuits 440 and 940, four four-bit wide data streams were described. Parallel-to-serial circuit 1300 may include 4-deep registers 1310, rotator 1320, and delay elements 1330.

A data unit input to parallel-to-serial circuit 1300 may be input to 4-deep registers 1310. Each of 4-deep registers 1310 may receive one of the four bits in the data unit. Each of 4-deep registers 1310 may also output one of its stored bits. The outputs may be rotated by rotator 1320, delayed by delay elements 1330, and output as output data streams 1340-0 through 1340-3.

As with delay elements 1010, each of delay elements 1330 may be implemented as, for example, a capacitive delay element, a digital latch, or another delay element. Each delay element 1330 may delay its input by one clock cycle. As shown in FIG. 13, output data stream 1340-0 may pass through three delay elements 1330 (i.e., delayed three clock cycles), output data stream 1340-1 is not delayed, output data stream 1340-2 may pass through one delay element 1330 (i.e., one clock cycle), and output data stream 1340-3 may pass through two delay elements 1330 (i.e., two clock cycles).

Rotator 1320 and 4-deep registers 1310 may be constructed identically to rotator 1020 and 4-deep registers 1030, respectively, and as shown in FIGS. 10, 11, and 12.

CONCLUSION

ECC codewords transmitted over optical links may be interleaved before being transmitted over the optical links. The interleaved data may be more resistant to clusters of multi-bit errors that may tend to occur on a particular optical link.

The foregoing description provides illustration and description, but is not intended to be exhaustive or to limit the invention to the precise form disclosed. Modifications and variations are possible in light of the above teachings or may be acquired from practice of the invention.

Also, certain portions of the implementations have been described as "components" that perform one or more functions. The term "component," may include hardware, such as a processor, an application specific integrated circuit (ASIC), or a field programmable gate array (FPGA), or a combination of hardware and software.

Further, while implementations have been described in the context of an optical network, this need not be the case. These implementations may apply to any form of circuit-switching network.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A device comprising:
   a plurality of input lines, the input lines carrying data;
   an error correction code (ECC) circuit coupled to the plurality of input lines, the ECC circuit supplying a plurality of codewords in series, the plurality of codewords being generated by the ECC circuit based on the data, each of the plurality of codewords including error correction information and a portion of the data;
   a serial-to-parallel circuit configured to receive each of the plurality of codewords in series, and supply a first plurality of data units in parallel, each of the first plurality of data units including information from a corresponding one of the plurality of codewords;
   an interleaver circuit configured to receive the first plurality of data units in parallel and output a second plurality of data units in parallel, each of the second plurality of data units including bits from different ones of the first plurality of data units;
   a parallel-to-serial circuit to receive the second plurality of data units in parallel from the interleaver circuit, to serialize the second plurality of data units, and to output the serialized second plurality of data units on a plurality of output data lines;
   where the serial-to-parallel circuit includes:
   a plurality of delay elements;
   a rotator circuit to receive data streams, corresponding to the plurality of serial codewords, delayed by the plurality of delay elements, the rotator circuit switching the received data streams to various ones of a plurality of rotator outputs, corresponding to each of the first plurality of data units in parallel; and
   a plurality of register circuits connected to receive the plurality of rotator outputs, store a bit received from one of the rotator outputs, and output another bit that was previously received from the rotator circuit.

2. The device of claim 1, where a quantity of the plurality of output lines is greater than a quantity of the plurality of input lines.

3. The device of claim 1, where the plurality of sequential codewords generated by the ECC circuit include codewords generated using parity check codes, Hamming codes, or Reed-Solomon codes.

4. A device comprising:
   an error correction code (ECC) circuit configured to generate error correction information for sequentially received input data and output a plurality of ECC codewords in series, each of the plurality of ECC codewords including the sequentially received input data and error correction information corresponding to the sequentially received input data;
   a serial-to-parallel circuit configured to convert the plurality of serial ECC codewords generated by the ECC circuit to codewords that overlap one another;
   an interleaver circuit configured to interleave the overlapping codewords; and
   a parallel-to-serial circuit to receive the interleaved overlapping codewords, serialize the interleaved overlapping codewords, and output the serialized interleaved codewords on a plurality of output lines,
   where the serial-to-parallel circuit comprises:
   a plurality of delay elements,
   a rotator circuit to receive data streams, corresponding to the plurality of serial ECC codewords, delayed by the plurality of delay elements, the rotator circuit switching the received data streams to various ones of a plurality of rotator outputs, and
   a plurality of register circuits connected to receive the plurality of rotator outputs, store a bit received from one of the rotator outputs, and output another bit that was previously received from the rotator circuit.

5. The device of claim 4, where the interleaver circuit groups identical bits from the overlapping codewords into a single data unit.

6. The device of claim 4, further comprising:
   a plurality of input lines to receive the input data, where a quantity of the plurality of output lines is greater than a quantity of the plurality of input lines.

7. The device of claim 4, where the plurality of serial ECC codewords generated by the ECC circuit include codewords generated using parity check codes, Hamming codes, or Reed-Solomon codes.

8. A device comprising:
   a plurality of input data lines, each of the plurality of input data lines receiving serial data in which error correction code (ECC) information is interleaved in the received serial data so that multiple sequential bits received on the input data lines are bits corresponding to different ECC codewords, where each ECC codeword includes data and error correction information generated for the received serial data;
   a serial-to-parallel circuit configured to convert the received serial data to parallel data;
   an interleaver to de-interleave the parallel data so that groups of bits within the parallel data include bits from a same one of the different ECC codewords;
   a parallel-to-serial circuit configured to receive the de-interleaved parallel data to convert the de-interleaved parallel data to serial data; and
   an ECC circuit connected configured to receive the serial data and correct errors in the serial data based on the ECC codewords;
   where the serial-to-parallel circuit includes:
   a plurality of delay elements to receive the received serial data and generate delayed data streams;
   a rotator circuit to receive the delayed data streams, the rotator circuit switching the received delayed data streams to various ones of a plurality of rotator outputs, corresponding to the parallel data; and
   a plurality of register circuits connected to receive the plurality of rotator outputs, store a bit received from one of the rotator outputs, and output another, previously received bit, from the rotator circuit.

9. The device of claim 8, where the plurality of input data lines include optical links.

10. The device of claim 8, where the ECC codewords include codewords generated using parity check codes, Hamming codes, or Reed-Solomon codes.

11. The device of claim 8, where the parallel-to-serial circuit includes:
    a plurality of register circuits connected to each receive a bit value from the de-interleaved parallel data, store the bit value, and output another, previously received bit value; and a rotator circuit to receive the output bit values from the plurality of register circuits on a plurality of rotator input signal lines and output a corresponding plurality of rotator output signal lines, the rotator circuit switching signals on the rotator input signal lines to various ones of the rotator output signal lines, where the rotator output signal lines each output, over multiple clock cycles, the serial data.

12. The device of claim 11, where the parallel-to-serial circuit further includes:
a plurality of delay circuits connected to the rotator output signal lines, the plurality of delay circuits delaying the serial data received on the rotator output signal lines.

* * * * *